United States Patent
Gabriel, III et al.

(10) Patent No.: US 6,909,298 B2
(45) Date of Patent: Jun. 21, 2005

(54) TEST SOCKET WITH INTEGRAL INDUCTOR AND METHOD OF MANUFACTURING USING SUCH A TEST SOCKET

(75) Inventors: Martin J. Gabriel, III, Austin, TX (US); Vu N. Do, Austin, TX (US); Justin E. Dougherty, Austin, TX (US); David H. Griffin, Dripping Springs, TX (US)

(73) Assignee: Silicon Laboratories, Inc., Austin, TX (US)

( * ) Notice: Subject to any disclaimer, the term of this patent is extended or adjusted under 35 U.S.C. 154(b) by 107 days.

(21) Appl. No.: 10/409,564

(22) Filed: Apr. 7, 2003

(65) Prior Publication Data

US 2004/0196059 A1 Oct. 7, 2004

(51) Int. Cl.[7] .............................................. G01R 31/02
(52) U.S. Cl. ..................................... 324/755; 324/158.1
(58) Field of Search ................................. 324/755, 765, 324/754, 761, 158.1; 439/66–91; 257/48, 490

(56) References Cited

U.S. PATENT DOCUMENTS

| | | | | |
|---|---|---|---|---|
| 5,734,176 A | * | 3/1998 | Oldfield | 257/48 |
| 5,929,649 A | * | 7/1999 | Cramer | 324/761 |
| 6,252,289 B1 | * | 6/2001 | Thompson et al. | 257/490 |
| 6,323,735 B1 | | 11/2001 | Welland et al. | |
| 6,541,988 B2 | * | 4/2003 | Dangelmayer et al. | 324/754 |
| 6,838,890 B2 | * | 1/2005 | Tervo et al. | 324/754 |

* cited by examiner

*Primary Examiner*—Vinh P. Nguyen
(74) *Attorney, Agent, or Firm*—Paul J. Polansky; Toler, Larson & Abel, LLP

(57) ABSTRACT

A test socket (600) includes first (602) and second (606) test leads and a first electrically conductive member (604). The first test lead is adapted to contact a first external inductor terminal of an integrated circuit (706). The second test lead (606) is adapted to contact a second external inductor terminal of the integrated circuit (706). The first electrically conductive member (604) extends between the first test lead (602) and the second test lead (606), thereby forming an inductance loop between the first external inductor terminal and the second external inductor terminal.

21 Claims, 8 Drawing Sheets

US 6,909,298 B2

TEST SOCKET WITH INTEGRAL INDUCTOR AND METHOD OF MANUFACTURING USING SUCH A TEST SOCKET

TECHNICAL FIELD

The present invention relates generally to integrated circuit testing, and more particularly to test sockets suitable for testing radio frequency (RF) integrated circuits and methods of testing integrated circuits.

BACKGROUND

Some integrated circuits are designed for use in generating variable frequency tuning signals for radio frequency (RF) devices such as cellular telephones, global positioning system (GPS) receivers, pagers, and the like. These devices are known generally as RF synthesizers. Wireless communication systems typically require frequency synthesis in both the receive path circuitry and the transmit path circuitry. For example, cellular phone standards in the United States and Europe define a cellular telephone system with communication centered in two frequency bands at about 900 MHz and 1800 MHz.

RF synthesizers use phase lock loops (PLLs) to synthesize the necessary tuning frequencies. The values of the loop dividers and reference dividers are programmable to generate different output frequencies to allow different channels to be tuned. Each PLL includes a voltage controlled oscillator formed by an inductance-capacitance (LC) oscillator. Since the VCO output frequency depends on the LC product, the output frequency can be controlled by adjusting the value of a variable capacitance.

Though the frequency synthesizer may be generally contained within an integrated circuit package, VCO inductors used for band selection purposes may be "off-package" or circuit board-mounted, and are connected to other package-contained PLL circuitry to form a frequency synthesizer circuit by means of contacts or pin connections. Off-package inductors are often mounted on a circuit board by the manufacturer.

With the higher-frequency bands now being used for cellular telephones and other similar applications, the values required for external inductors have been reduced and may be, for example, on the order of tenths of nanoHenrys (nH). These smaller inductances allow the off-chip inductors to be made more simply by using short traces on the printed circuit board between two integrated circuit pins rather than by discrete inductors. However these values are becoming so small that undesirable parasitic effects can no longer be ignored.

These parasitic effects are amplified during manufacturing test, when instead of being permanently mounted to a printed circuit board, the integrated circuit is temporarily inserted into a test socket while the pins are driven and/or sampled by an integrated circuit tester. The printed circuit board inductance can be simulated during manufacturing test by adding a similar trace on the test board. However a sufficiently small inductance within a narrow range of values has been difficult to achieve using known test hardware. What is needed then is a test apparatus that provides an external inductor having an inductance falling within a desirably narrow range of values. This and other desirable features and characteristics of the present invention will become apparent from the subsequent detailed description and the appended claims, taken in conjunction with the accompanying drawings and the foregoing technical field and background.

BRIEF SUMMARY

A test socket includes first and second test leads and a first electrically conductive member. The first test lead is adapted to contact a first external inductor terminal of an integrated circuit. The second test lead is adapted to contact a second external inductor terminal of the integrated circuit. The first electrically conductive member extends between the first test lead and the second test lead, thereby forming an inductance loop between the first external inductor terminal and the second external inductor terminal.

A method is also provided for manufacturing a radio frequency (RF) integrated circuit having first and second external inductor pins. The first external inductance pin is connected to a first test lead formed in a test socket. The second external inductance pin is connected to a second test lead formed in the test socket. The first test lead is shorted to the second test lead by an electrically conductive member such that an inductance loop is formed between the first and second external inductor pins. A test of the integrated circuit is executed while the first and second external inductor pins are in contact with the first and second test leads.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the drawings.

Figure 1:
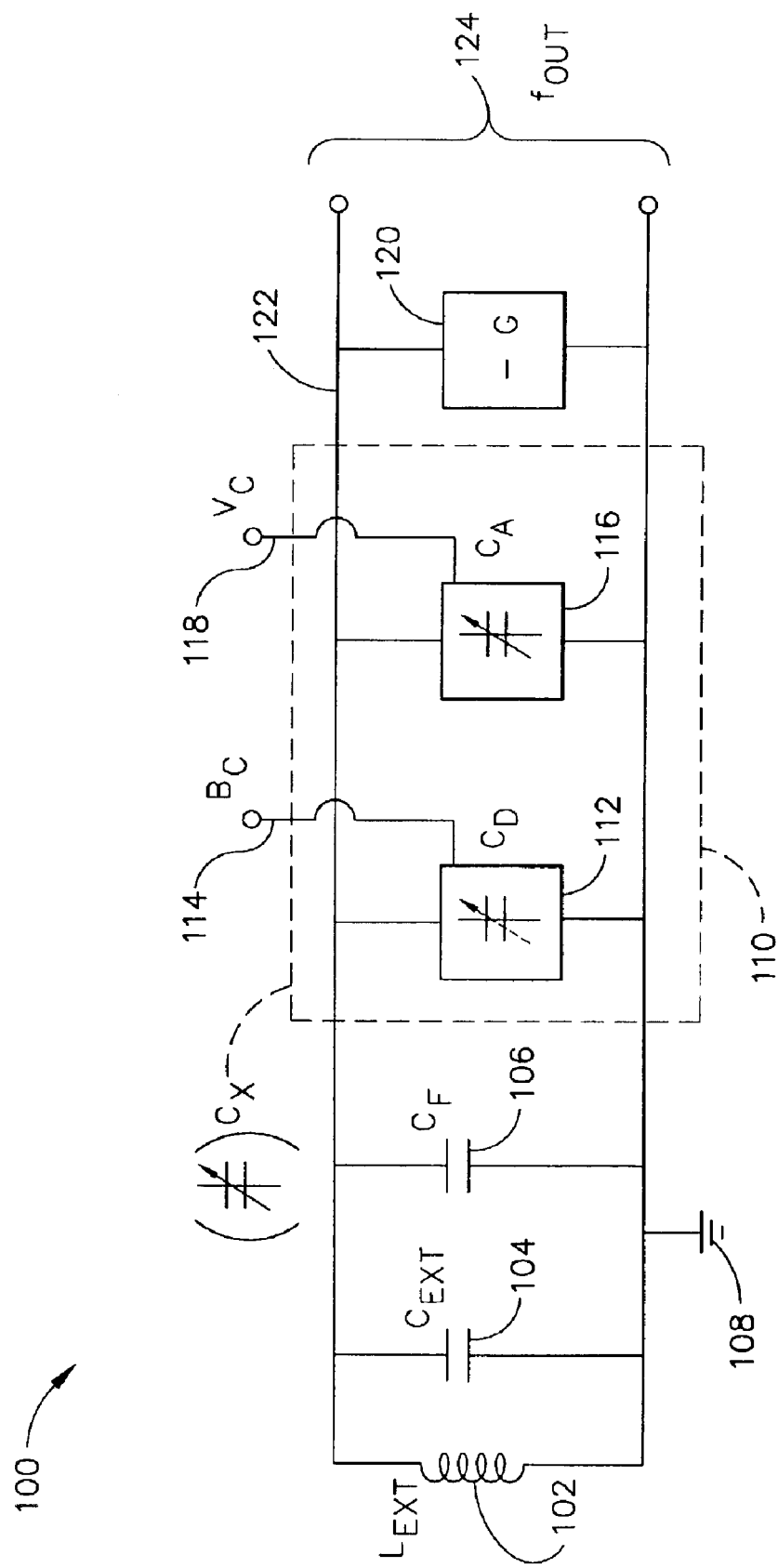
FIG. 1 illustrates a schematic diagram of a portion of a radio frequency (RF) oscillator on an integrated circuit for use with a test socket according to the present invention.

FIG. 1 illustrates a schematic diagram of a portion of a radio frequency (RF) oscillator 100 on an integrated circuit for use with a test socket according to the present invention. As used herein, "radio frequency" means a frequency capable of carrying useful information from about 3 kilohertz (kHz) to thousands of gigahertz (GHz). VCO 100 produces an output signal 124 between an output terminal 122 and a ground terminal 108 having a frequency labeled "$f_{OUT}$" using an LC tank oscillator having an external inductor 102 labeled "$L_{EXT}$". Inductor 102 may be located on the printed circuit board and formed by the inductance in a board trace without the need for a discrete inductor. Some of the inductance may also be formed by on-package inductors as taught by Welland et al. in U.S. Pat. No. 6,323,735, the disclosure of which is herein incorporated by reference. When using an on-package inductance the external portion can then be used for band selection using a relatively small-valued inductor. An internal capacitance is formed by the parallel combination of a fixed capacitor 106 labeled "$C_F$" and a variable capacitor 110 labeled "$C_X$". An appropriate value for $C_X$ 110 can be achieved with a discretely variable capacitance $C_D$ 112 in conjunction with a continuously variable capacitance $C_A$ 116. The discretely variable capacitance $C_D$ 112 is controlled by a digital control word $B_C$ 114, and the continuously variable capacitance $C_A$ 116 is controlled by a voltage control signal $V_C$ 118. It is noted that the digital control word $B_C$ 114 and the voltage control signal $V_C$ 118 may be a single signal or a plurality of signals, as desired, depending upon the implementation for the discretely variable capacitance $C_D$ 112 and the continuously variable capacitance $C_A$ 116. The fixed capacitance $C_F$ 106 represents internal parasitic capacitance along with any desired fixed capacitance connected internally to the integrated circuit. A negative conductance source (−G) 120 is also provided to take care of losses in the VCO 100.

In operation, the discretely variable capacitance $C_D$ 112 of FIG. 1 may be used after manufacture to dynamically compensate for any component tolerance problems including all of the internal capacitance values, any external capacitor $C_{EXT}$ 104, and the on-package inductor (not shown in FIG. 1) used in conjunction with $L_{EXT}$ 102. In addition, the discretely variable capacitance $C_D$ 112 may be used to provide coarse tuning of the desired output frequency, thereby reducing the frequency range that must be covered by variations in the capacitance of the continuously variable capacitance $C_A$ 116. After coarse tuning by the discretely variable capacitance $C_D$ 112, the continuously variable capacitance $C_A$ 116 may be used to provide fine tuning of the desired output frequency. This coarse and fine tuning initially calibrates the output frequency $f_{OUT}$ 124 to the desired output frequency. After the initial calibration, the continuously variable capacitance $C_A$ 116 may be used to compensate for any post-calibration frequency drift. Such post-calibration frequency drift will typically occur due to a variety of factors, including for example temperature variations. In this way, a high-frequency PLL frequency synthesizer may be provided that produces an output frequency having phase noise of less than about −110 dBc/Hz at 100 kHz from the output frequency, wherein dBc represents decibels with respect to the carrier frequency.

An example will now be provided for the coarse and fine tuning that may be provided by VCO 100 of FIG. 1. The United States IS-54 cellular phone standard utilizes on the order of eight hundred 30 kHz wide channels in a frequency band of 869 MHz–894 MHz for transmitting information from a base station to a mobile unit. One receive channel may be, for example, at 870.03 MHz. Assuming that a cellular phone application has been designed to have an IF frequency of 250 MHz, the RF mixing frequency that must be synthesized by the frequency synthesizer for this channel would need to be 1120.03 MHz. (It is noted that for the 900 MHz frequency band, the RF mixing frequency utilized is typically above the channel frequency, although an RF mixing frequency below the channel frequency may also be used.) The discretely variable capacitance ($C_D$) 112 may be designed to coarsely tune the RF output frequency of the frequency synthesizer to about 0.1% of the desired frequency of 1120.03 MHz or to within about 1 MHz. The continuously variable capacitance ($C_A$) 116 may be designed to provide a frequency range of about 1% of the desired frequency of 1120.03 MHz or a range of about 11 MHz, which is about 10 times the coarse tuning accuracy of the discretely variable capacitance ($C_D$) 112. This frequency range allows the continuously variable capacitance ($C_A$) 116 to finely tune the RF output frequency of the frequency synthesizer to the desired frequency of 1120.03 MHz and to compensate for post-calibration frequency drift. The initial voltage input values for the continuously variable capacitance ($C_A$) 116 may be selected so that the continuously variable capacitance ($C_A$) 116 may move the RF output frequency either up or down by roughly the same amount.

Because of the ability to coarsely tune VCO 100 using capacitor $C_D$ 112, the value of $L_{EXT}$ can have a tolerance of approximately ±10% compared to its nominal value. This tolerance is sufficiently large to enable users to manufacture printed circuit boards with external inductors formed by board traces and consistently meet this tolerance.

In order to perform final test of the integrated circuit containing VCO 100 after integrated circuit fabrication and packaging, it is also necessary to couple an external inductance to the integrated circuit pins to equal the desired value of $L_{EXT}$. In known test systems this inductance is provided in the same way as for printed circuit boards, by using a trace on the board whose inductance equals the desired inductance. However these test methods have not proven to be sufficiently reliable, as will be shown with reference to FIGS. 2–4 below.

Figure 2:
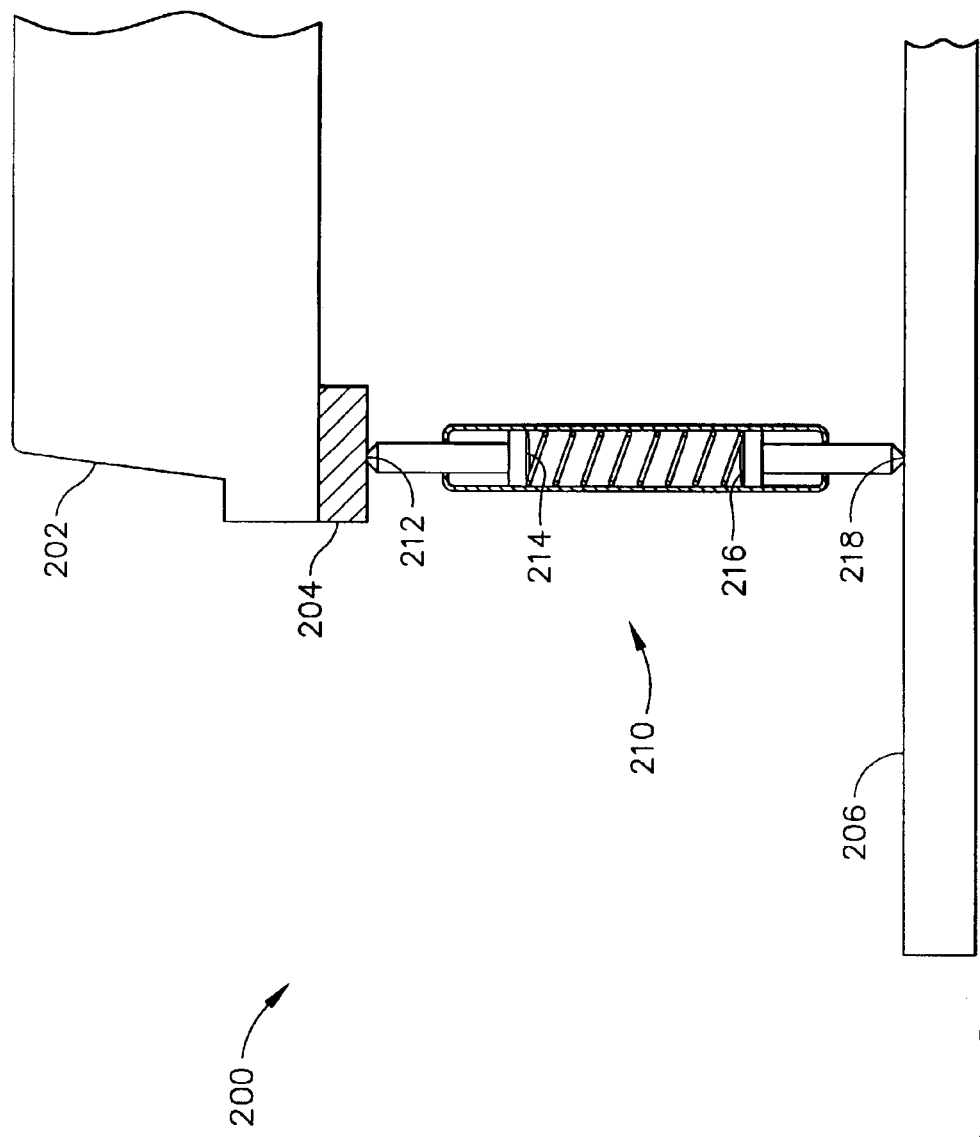
FIG. 2 illustrates a side view of a spring probe used to connect an integrated circuit RF oscillator to a test board known in the prior art.

FIG. 2 illustrates a side view 200 of an RF test apparatus using a spring probe known in the prior art. In this example an RF integrated circuit has a so-called micro leadframe package (MLP) 202 which includes pins like exemplary pin 204 flush with or slightly protruding from the underside thereof. MLP 202 is electrically connected to a test board 206 by a spring probe 210. When pin 204 is used as an external inductor pin, an inductance loop is formed from pin 204, through spring probe 210, through a trace on test board 206 to another spring probe, and through the other spring probe to the other external inductor pin on MLP 202. Spring probe 210 forms four contact points, a device pin to spring probe interface 212, a spring probe to barrel interface 214, a barrel to spring probe interface 216, and a spring probe to test board trace interface 218. Similar contact points are formed between the board trace and the other external inductor terminal. Thus there are a total of eight contact points in the inductance loop. These contact points add to the loop resistance and inductance such that the inductance loop generally has an inductance of greater than 1.0 nanoHenrys (nH) and thus is too large to be of use with VCO 100 operating at the frequencies specified above. In addition, wear caused by repeated usage can significantly increase loop inductance and loop resistance. Also the spring probe includes internal contact points that can affect loop inductance and loop resistance.

Figure 3:
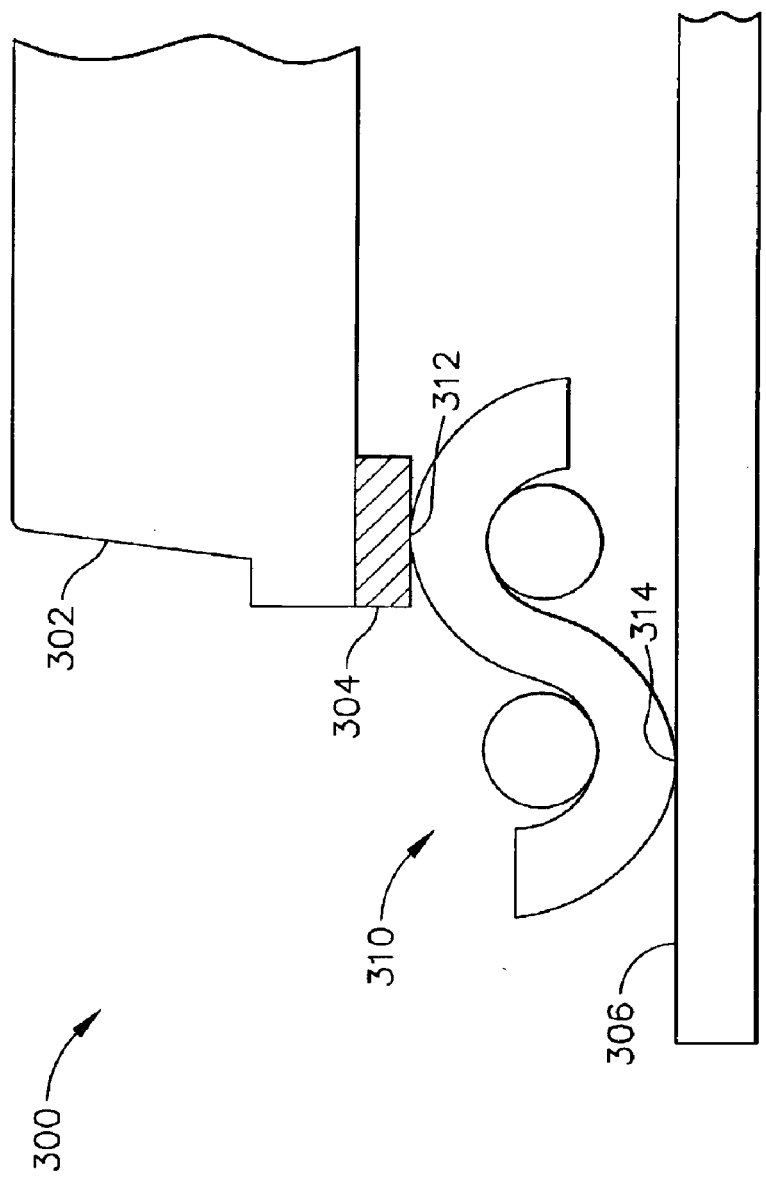
FIG. 3 illustrates a side view of an "S" hook used to connect an integrated circuit RF oscillator to a test board known in the prior art.

FIG. 3 illustrates a side view of an RF test apparatus 300 using an "S" hook 310 known in the prior art. Apparatus 300 is adapted for testing an RF oscillator housed in an MLP 302 having an external inductor pin 304 forming two contact points 312 and 314 between pin 304 and a test board 306.

Figure 4:
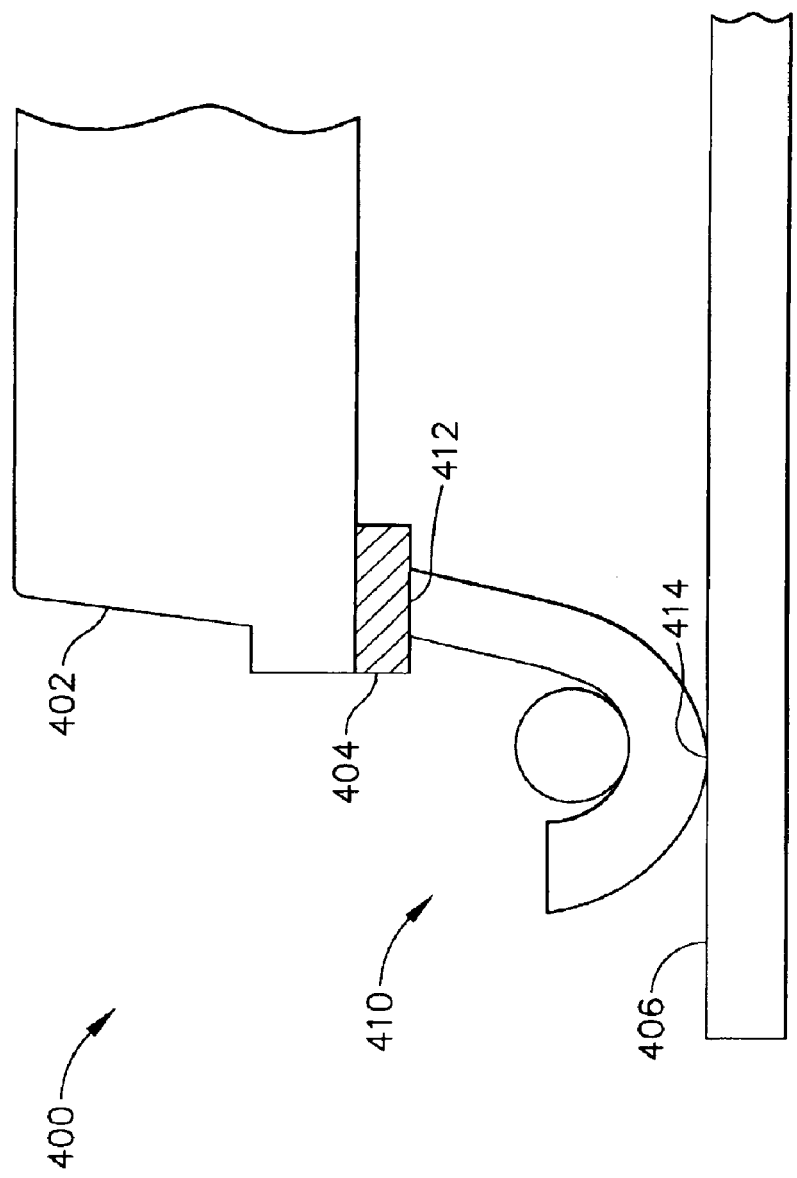
FIG. 4 illustrates a side view of an "J" hook used to connect an integrated circuit RF oscillator to a test board known in the prior art.

With the return path to the second external inductor pin the S hook apparatus forms a total of four contact points. FIG. 4 illustrates a side view of an RF test apparatus 400 using a "J" hook 410 known in the prior art. Apparatus 400 is adapted for testing an RF oscillator housed in an MLP 402 having an external inductor pin 404 forming two contact points 412 and 414 between pin 404 and a test board 406. With the return path to the second external inductor pin the J hook apparatus forms a total of four contact points. While the S-hook and J-hook designs perform adequately when first implemented, contact points 314 and 414 begin to wear against the surface of test boards 306 and 406 after repeated testing and the loop inductance begins to drift outside the required range. This drifting requires the test board, which is expensive, to be changed frequently.

Figure 5:
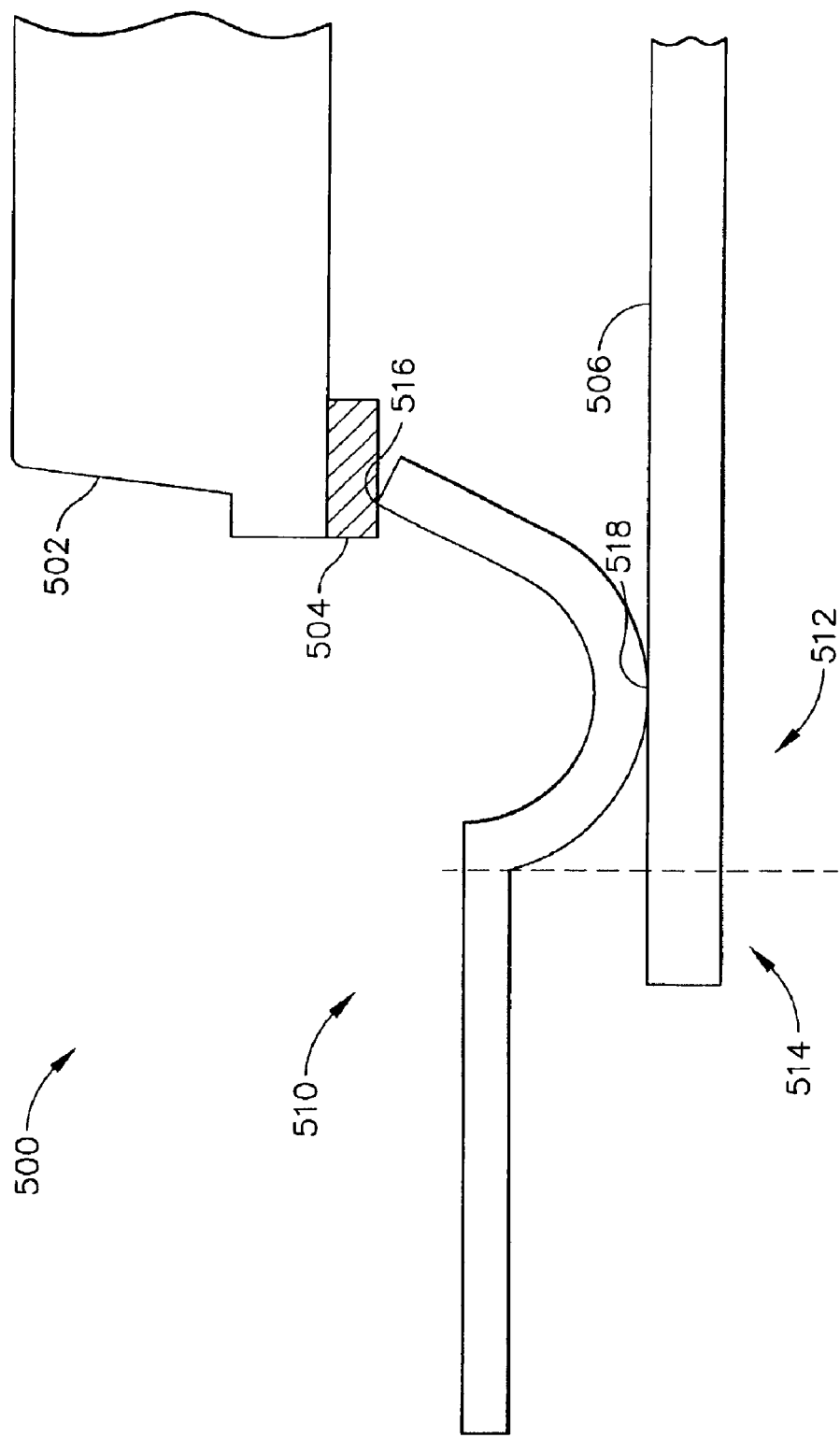
FIG. 5 illustrates a side view of a connector for use with an integrated circuit RF oscillator according to the present invention.

FIG. 5 illustrates a side view of an RF test apparatus 500 according to the present invention. Apparatus 500 is adapted for testing an RF oscillator housed in an MLP 502 having an external inductor pin 504 on the underside of MLP 502. A test pin 510 forms an electrical contact 516 to external inductor pin 504. Test pin 510 has a first portion 512 in the form of an elongated arc one end of which contacts external inductor pin 504, and the other end of which interfaces to a second portion 514. Second portion 514 is generally planar. Test pin 510 forms a physical contact with a test board 506 at a contact point 518. At contact point 518, the test board is electrically non-conductive. Elongated arc portion 512 is compliant to allow MLP 502 to be forcibly inserted into a test socket so that test pin 510 and all other test pins can make reliable physical and electrical contact to their corresponding device pins.

Unlike the known test pins illustrated in FIGS. 2–4 above, however, the external inductor is not formed by a trace on test board 506 and contact point 518 is a physical contact point to an electrically nonconductive area on test board 506. The external inductor is formed by second portion 514 being shorted to a corresponding second portion of a test pin that is coupled to the second external inductor terminal. Thus the inductance loop is formed not on the test board but rather between the test pins, and thus within the test socket.

Figure 6:
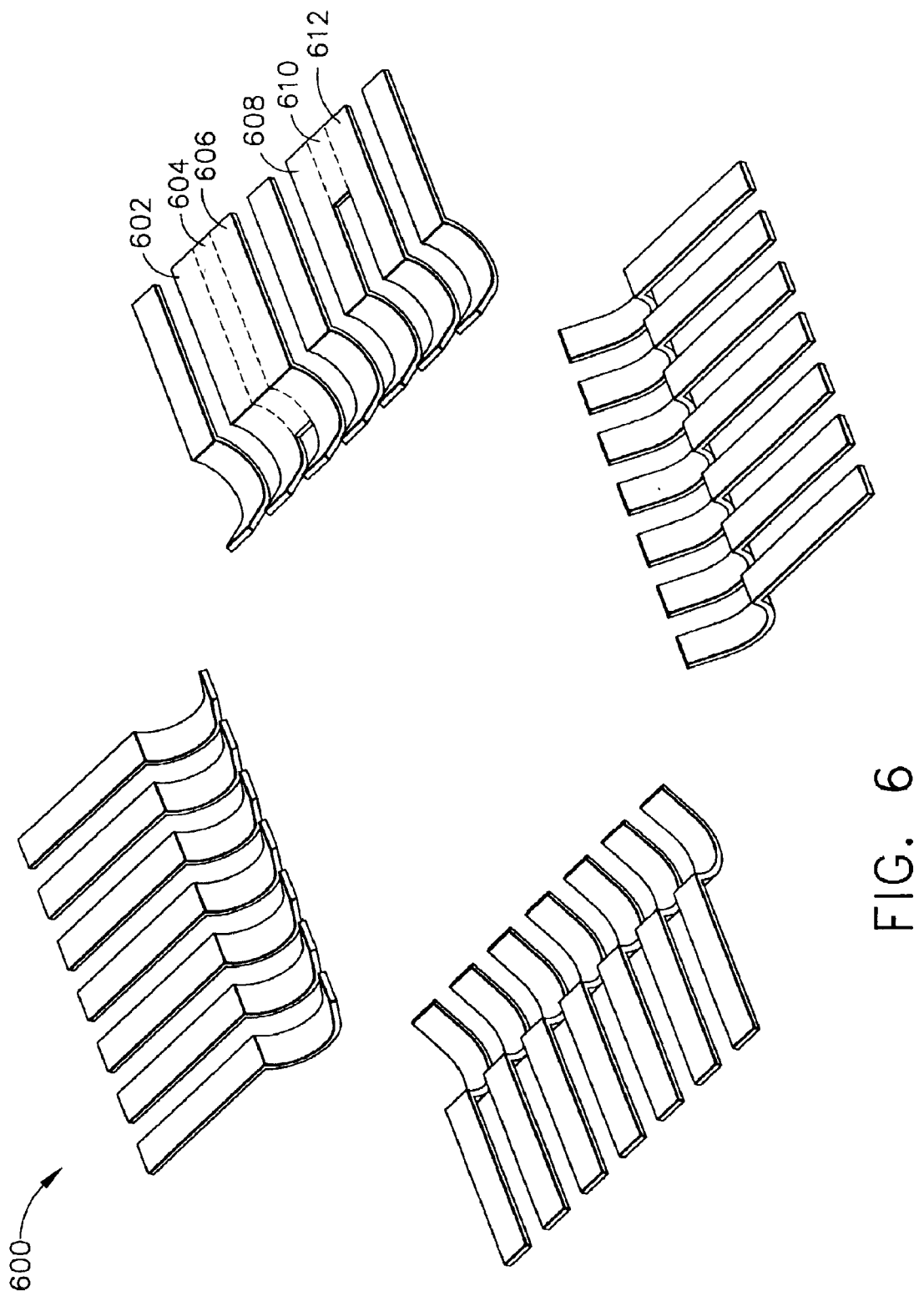
FIG. 6 illustrates a perspective view of a complete set of connectors for use in testing the integrated circuit oscillator of FIG. 1.

This feature is better understood with reference to FIG. 6, which illustrates a perspective view of a complete set of test leads 600 for use with a 28-pin integrated circuit containing the oscillator of FIG. 1. As shown in FIG. 6, test leads 600 include a corresponding set of twenty-eight leads for connecting to the integrated circuit, including a first lead 602 for contacting to a first external inductor pin and a second test lead 606 for contacting to a second external inductor pin. Test leads 602 and 606 are shorted together by a conductive member 604 formed of the same conductive material as test leads 602 and 606, and as shown in FIG. 6 form a single member. Conductive member 604 shorts the planar portions and a part of the elongated arc portions of test leads 602 and 606 together to form an inductance loop between the first external inductor terminal and the second external inductor terminal having the desired inductance. Similarly, test leads 600 include a third test lead 608 for contacting to a third external inductor pin and a fourth test lead 612 for contacting a fourth external inductor pin. Test leads 608 and 612 are shorted together by a conductive member 610 formed of the same conductive material as test leads 608 and 612. However conductive member 610 is formed only between part of the planar portions of test leads 608 and 612 because the corresponding external inductor does not require as large an inductance as between test leads 602 and 606. As should be apparent from these examples, the size of the electrically conductive member can be varied to thereby vary the inductance.

A test apparatus using the disclosed test pins and conductive members limits the points of contact in the inductance loop to two. By not contacting the test board on the most sensitive part of the circuit the apparatus improves the repeatability of the inductance loop. The inductance can be varied to accommodate different external inductor requirements. For example the test socket illustrated in FIG. 6 supports two pairs of external inductor pins requiring different inductances. Since it makes physical but not electrical contact with the test board, it also eliminates the effect of wear on the test board. Furthermore if the loop inductance is ever out of specification, only the socket insert need be changed instead of the test board, which is significantly more expensive.

The minimum inductance can also be made much smaller than the known sockets. By connecting two adjacent pins close to the device, an inductance loop of less than 0.1 nH can be created. By contrast the minimum spring probe inductance is approximately 1 nH, and the minimum inductance using an S hook or a J hook loop is approximately 0.5 nH.

Figure 7:
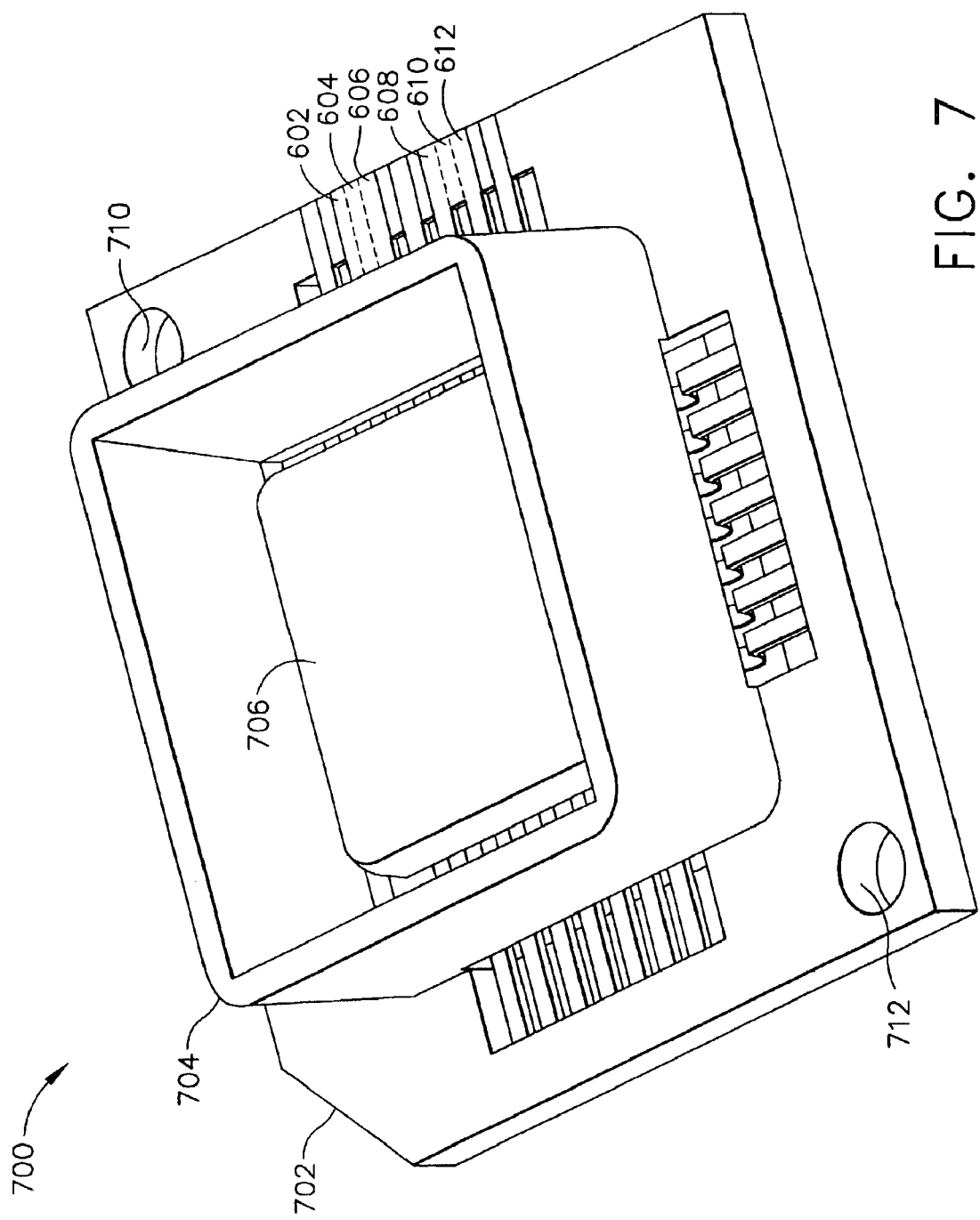
FIG. 7 illustrates a perspective view of a test socket insert using the connectors of FIG. 6.

FIG. 7 illustrates a perspective view of a test socket insert 700 using the test pins of FIG. 6. Test socket insert 700 forms a portion of a test socket and is designed to attach to a socket body. The full test socket assembly in turn attaches on one side to a test board and on the other side, through further hardware, to a machine known as a handler. Because test socket insert 700 forms a modular portion that can be detached from the remainder of the test socket, it can be easily replaced during use without having to replace the entire socket. Thus it is more economical than unitary sockets.

As shown in FIG. 7 test socket insert 700 includes a base 702 which encapsulates some of the planar portions of the test pins. A guide 704 is formed in a center portion of test socket insert 700 and is adapted to direct an integrated circuit 706 into contact with test pins 600. To achieve this guide 704 includes a substantially straight outer surface along with a tapered inner surface. Test socket insert 700 also includes holes 710 and 712 to allow socket 700 to be mounted to the socket body.

Instead of test leads formed as shown in FIG. 5, other shapes are possible. For example, test leads whose first portions are straight and angled upward between the planar second portions and the corresponding integrated circuit pins may also be used.

Figure 8:
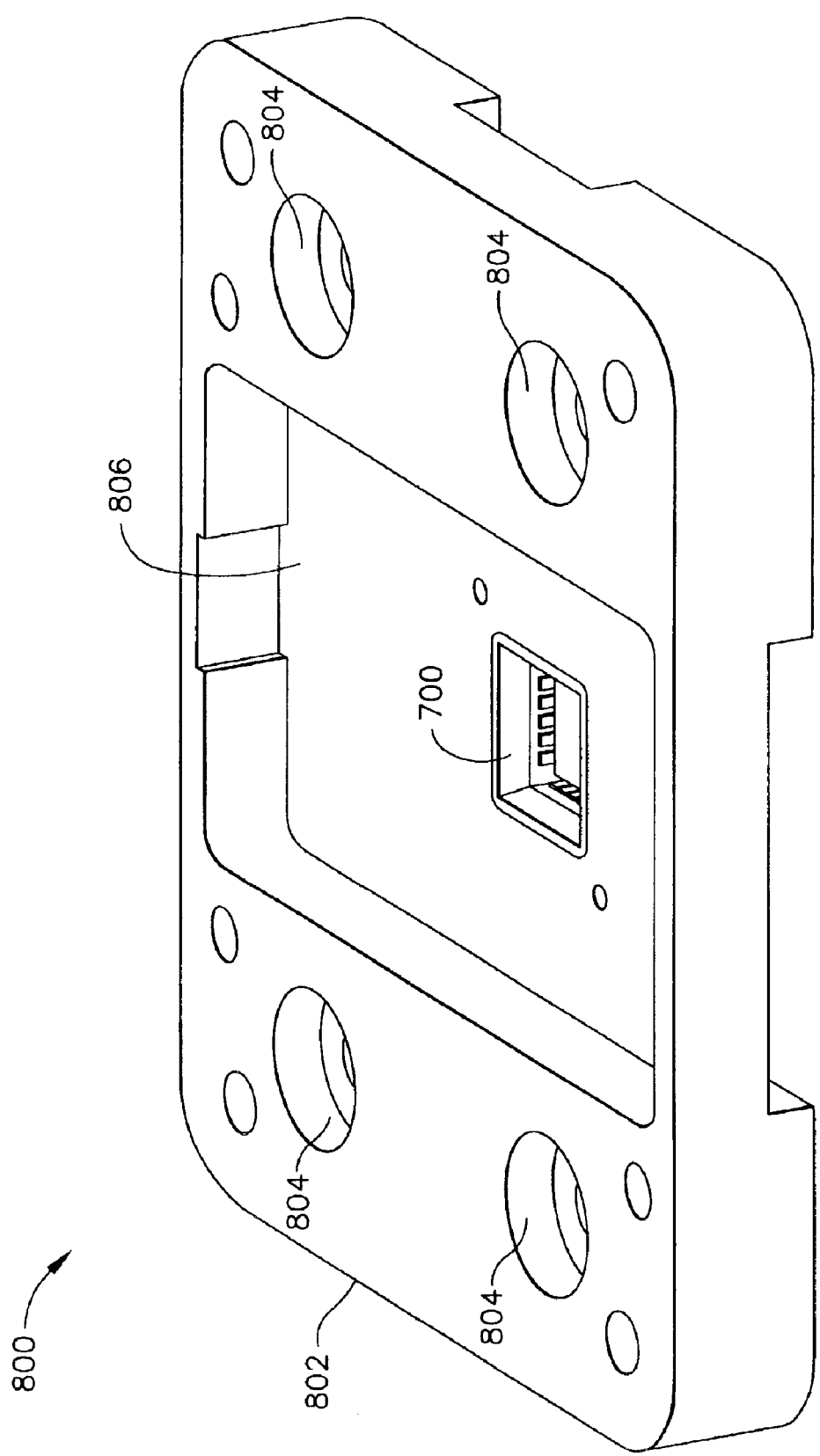
FIG. 8 illustrates a perspective view of a test socket which includes a socket body into which the test socket insert of FIG. 7 may be attached.

FIG. 8 illustrates a perspective view of a test socket 800 which includes a socket body 802 into which socket insert 700 may be attached. As shown in FIG. 8, socket insert 700 is inserted from the underside of socket body 802 and is attached with alignment pins through holes 710 and 712 (and held by compression between the socket and test board). Socket body 800 includes four larger sized holes similarly labeled 804 by which it may be attached to the test board. Socket body 800 also includes a recessed portion 806 to facilitate clearance for the handler plunger. By forming an easily removable portion of socket 800, socket insert 700 may be replaced without incurring the expense of replacing all of socket 800 after use.

Testing occurs late in the manufacturing process, and using socket insert 700 integrated circuit 706 may be tested as follows. Socket insert 700 is mounted onto socket body 802 by affixing it using, for example, alignment pins through holes 710 and 712. Socket body 802 is mounted onto the test board. The test board is attached to a surface of an integrated circuit tester's "test head". The handler is then placed adjacent to the test socket and secured to the test socket. Integrated circuit 706 is placed into an input track of the handler and is manipulated until it is in position to be tested. A plunger forcibly inserts the integrated circuit into the test socket by applying a force to the top side of integrated circuit 706. The tapered inner portion of socket 700 assists the plunger by directing integrated circuit 706 into the central portion of socket 700 so that the integrated circuit pins and corresponding test leads come into contact. Since the first portions of the test leads are compliant, they allow the application of a sufficient amount of force so that all pins make good physical and electrical contact with their corresponding test leads. When the insertion operation is complete, the handler sends a signal to the integrated circuit tester to start the test. The integrated circuit tester then tests the integrated circuit by providing appropriate signals on power supply and input pins and measuring appropriate responses on output pins. The tests include tests to determine if the internal components in conjunction with the external inductance loop are functional to allow the oscillator to oscillate to within a range of the desired frequency. When the test is complete, the integrated circuit tester sends a signal to the handler to extract integrated circuit 706 from socket 700, and the handler directs integrated circuit 706 to an output track to a "bin" which corresponds to a result of the test, including a passing bin and at least one failing bin.

While the test socket insert and test method have been described in the context of an RF frequency synthesizer requiring an extremely small external inductance, it should be apparent that they are applicable to other types of integrated circuits that require an external conductance for generating or processing signals. For example they are also applicable to integrated circuits that use the external loop for option selection. The socket may also be used to provide an extremely low resistance connection between integrated circuit pins, such as that required to form a Kelvin connection. To make such a Kelvin connection, the test socket could provide an extremely low resistance path between an external resistor drive terminal of the integrated circuit and a high input impedance external resistor sense terminal of the integrated circuit. Furthermore the external inductor pins and their corresponding test leads need not be adjacent as shown. For example the conductive member could short together two test leads that are separated by one or more intervening test leads. In this example the conductive member could extend between the test leads along the outside of the socket and the intervening test leads would have planar portions that do not extend all the way outward but just enough to be firmly encapsulated in the base of the socket.

While an exemplary embodiment(s) has been presented in the foregoing detailed description of the invention, it should be appreciated that a vast number of variations exist. It should also be appreciated that these exemplary embodiments are only examples, and are not intended to limit the scope, applicability, or configuration of the invention in any way. Rather, the foregoing detailed description will provide those skilled in the art with a convenient road map for implementing a preferred embodiment of the invention. It being understood that various changes may be made in the function and arrangement of elements described in an exemplary preferred embodiment without departing from the spirit and scope of the invention as set forth in the appended claims.

We claim:

1. A test socket adapted to test an integrated circuit that has first and second external inductor terminals and that operates using an inductance between the first and second external inductor terminals, the test socket comprising:
   a first test lead adapted to contact the first external inductor terminal of said integrated circuit;
   a second test lead adapted to contact the second external inductor terminal of said integrated circuit; and
   a first electrically conductive member extending between said first test lead and said second test lead thereby forming an inductance loop between said first external inductor terminal and said second external inductor terminal.

2. The test socket of claim 1 wherein said first and second test leads each comprise a substantially planar portion.

3. The test socket of claim 2 further comprising a base for encapsulating at least part of said substantially planar portions of said first and second test leads.

4. The test socket of claim 1 wherein said integrated circuit is characterized as comprising an oscillator.

5. The test socket of claim 4 wherein said oscillator is part of a frequency synthesizer.

6. The test socket of claim 1 further comprising third and fourth test leads adapted to contact third and fourth external inductor terminals of said integrated circuit, respectively, and a second electrically conductive member extending between said third and fourth test leads, thereby forming a second inductance loop between said third external inductor terminal and said fourth external inductor terminal.

7. The test socket of claim 6 wherein said first electrically conductive member and said second electrically conductive member have different sizes.

8. A test socket comprising:
   a first test lead adapted to contact a first external inductor terminal of an integrated circuit, said first test lead comprising a substantially planar portion;
   a second test lead adapted to contact a second external inductor terminal of said integrated circuit, said second test lead comprising a substantially planar portion;
   a first electrically conductive member extending between said first test lead and said second test lead thereby forming an inductance loop between said first external inductor terminal and said second external inductor terminal;
   a base for encapsulating at least part of said substantially planar portions of said first and second test leads; and
   a guide affixed to said base for directing said integrated circuit into a center portion of said base such that a plurality of pins of said integrated circuit contact corresponding ones of a plurality of test leads including said first and second test leads when said integrated circuit is inserted into the test socket.

9. The test socket of claim 8 wherein said guide is characterized as having a substantially straight outer surface and a tapered inner surface.

10. A test apparatus comprising:
   a test board;
   a test socket affixed to said test board and comprising:
      a base adapted to be mounted to said test board and having an opening in a center portion thereof;
      a plurality of test leads each of which is adapted to couple to corresponding pins of an integrated circuit and is partially encapsulated by said base, wherein a portion of each of said plurality of test leads extends into said center portion of said base;
      a guide affixed to said base for directing said integrated circuit into said center portion of said base such that said corresponding pins of said integrated circuit contact corresponding ones of said plurality of test leads when said integrated circuit is inserted into said test socket;

wherein said plurality of test leads comprises a first test lead adapted to be coupled to a first external inductor pin of said integrated circuit, a second test lead adapted to be coupled to a second external inductor pin of said integrated circuit, and a first electrically conductive member coupled between at least a portion of said first test lead and said second test lead.

11. The test apparatus of claim 10 wherein each of said plurality of test leads comprises a substantially planar portion.

12. The test socket of claim 11 wherein said base encapsulates at least part of said substantially planar portions of said plurality of test leads.

13. The test apparatus of claim 10 wherein a first contact point between said test board and said first test lead and a second contact point between said test board and said second test lead are characterized as being electrically non-conductive.

14. The test apparatus of claim 10 wherein said guide is characterized as having a substantially straight outer surface and a tapered inner surface.

15. The test apparatus of claim 10 wherein said integrated circuit is characterized as comprising an oscillator.

16. The test apparatus of claim 15 wherein said oscillator is part of a frequency synthesizer.

17. The test apparatus of claim 10 further comprising third and fourth test leads adapted to contact third and fourth external inductor terminals of said integrated circuit, respectively, and a second electrically conductive member extending between said third and fourth test leads, thereby forming a second inductance loop between said third external inductor terminal and said fourth external inductor terminal, wherein said first and second electrically conductive members have different sizes.

18. A method for manufacturing a radio frequency (RF) integrated circuit having first and second external inductor pins comprising the steps of:

connecting the first external inductance pin to a first test lead formed in a test socket;

connecting the second external inductance pin to a second test lead formed in said test socket;

shorting said first test lead to said second test lead by an electrically conductive member such that an inductance loop is formed between the first and second external inductor pins; and executing a test of the integrated circuit in which the integrated circuit operates using said inductance loop while the first and second external inductor pins are in contact with said first and second test leads.

19. The method of claim 18 wherein said steps of connecting the first external inductance pin to said first test lead and connecting the second external inductance pin to said second test lead comprise the step of forcibly inserting the integrated circuit into said test socket.

20. The method of claim 19 wherein said step of forcibly inserting the integrated circuit into said test socket comprises the step of forcibly inserting the integrated circuit into said test socket through a guide affixed to a base of said test socket.

21. A test socket comprising:

a first test lead adapted to contact a first external terminal of an integrated circuit;

a second test lead adapted to contact a second external terminal of said integrated circuit; and a first electrically conductive member extending between said first test lead and said second test lead thereby forming a conductive loop between said first external terminal and said second external terminal, wherein said first external terminal is characterized as being a drive terminal, said second external terminal is characterized as being a sense terminal, and said conductive loop is used to form a Kelvin connection.

* * * * *